United States Patent
Piazza

(10) Patent No.: US 7,783,903 B2
(45) Date of Patent: Aug. 24, 2010

(54) LIMITING POWER CONSUMPTION BY CONTROLLING AIRFLOW

(75) Inventor: William Joseph Piazza, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 571 days.

(21) Appl. No.: 11/834,960

(22) Filed: Aug. 7, 2007

(65) Prior Publication Data

US 2009/0044027 A1 Feb. 12, 2009

(51) Int. Cl.
G06F 1/20 (2006.01)
G06F 1/26 (2006.01)
G06F 1/32 (2006.01)

(52) U.S. Cl. .................. 713/300; 713/320; 713/322; 361/679.46; 361/688

(58) Field of Classification Search .................. 713/300, 713/320, 322, 323, 340; 361/679, 688
See application file for complete search history.

(56) References Cited

U.S. PATENT DOCUMENTS

| | | | |
|---|---|---|---|
| 6,006,168 A | 12/1999 | Schumann et al. | |
| 6,367,023 B2 | 4/2002 | Kling et al. | |
| 7,051,221 B2 | 5/2006 | Clabes et al. | |
| 7,054,721 B2 | 5/2006 | Malone et al. | |
| 7,062,933 B2 | 6/2006 | Burns et al. | |
| 7,076,672 B2 | 7/2006 | Naveh et al. | |
| 7,167,993 B1 | 1/2007 | Thomas et al. | |
| 7,171,572 B2 | 1/2007 | Yamaji et al. | |
| 7,194,641 B2 | 3/2007 | Hack | |
| 7,401,644 B2* | 7/2008 | Ziarnik et al. | 165/287 |
| 7,506,190 B2* | 3/2009 | Thomas et al. | 713/322 |
| 2003/0188211 A1* | 10/2003 | Chen | 713/322 |
| 2004/0159904 A1 | 8/2004 | Clabes et al. | |
| 2006/0047808 A1* | 3/2006 | Sharma et al. | 709/224 |
| 2006/0253633 A1* | 11/2006 | Brundridge et al. | 710/104 |
| 2006/0254296 A1 | 11/2006 | Finkelstein et al. | |
| 2006/0259793 A1* | 11/2006 | Moore et al. | 713/300 |

* cited by examiner

*Primary Examiner*—Mark Connolly
(74) *Attorney, Agent, or Firm*—Cynthia G. Seal; Jeffrey L. Streets

(57) ABSTRACT

A power management scheme is disclosed wherein power limits are imposed on devices of an electronic system using selective airflow reduction. In one embodiment, each server in a rack system includes a throttling system for maximizing processor throughput within a fixed temperature constraint. An airflow system is capable of providing a variable amount of airflow to each server. The power consumption for each server is detected by an external power meter circuit and monitored by a controller operatively connected to the airflow source. The controller selectively reduces the amount of airflow to each server in relation to its power consumption, to induce an amount of throttling of each server sufficient to impose its respective power limit.

20 Claims, 4 Drawing Sheets

LIMITING POWER CONSUMPTION BY CONTROLLING AIRFLOW

BACKGROUND OF THE INVENTION

1. Field of the Invention

The present invention relates to power management in electronic systems, including techniques for power managing rack-mounted servers.

2. Description of the Related Art

Servers and other computer hardware are often grouped together on a rack to conserve space and place the servers and infrastructure in a central location for access by an administrator. Managing these "rack systems" can be less difficult and less expensive than separately administering a multitude of scattered servers. A variety of rack system designs are available in the market, and range in size and density. Some rack systems use essentially standalone servers deployed in rack-mounted or tower configuration. A higher density rack system can be realized using blade servers, which may be implemented as thin, pluggable boards that slide into a chassis designed specifically to house multiple units. Blade servers generally have a narrower form factor and greater density, achieved in part due to sharing system resources such as cooling and power. Some of the more compact rack system server arrangements presently available include the SYSTEM X servers and eServer BLADECENTER available from IBM (IBM, BLADECENTER, and SYSTEM X are registered trademarks of International Business Machines Corporation, Armonk, N.Y.).

Power management is important for controlling many aspects of operating a rack system, such as the costs of operating the servers, the heat generated by the servers, and the performance and efficiency of the system. A variety of power management options are available. Some systems limit ("cap") server energy consumption by measuring power draw and instantaneously responding to increases in power consumption by invoking a throttling mechanism when a power threshold is reached. Other systems are targeted more toward controlling average power excursions over time. The IBM PowerExecutive™ is an example of a power management system available for selected IBM BLADECENTER and SYSTEM X servers, allowing direct power monitoring through the IBM Director management interface. This can be beneficial for customers who must operate a system within a fixed power constraint, or who want to budget a certain amount of power to a group of servers. Further examples of power management schemes are provided in U.S. Pat. No. 7,155,623 to IBM, disclosing a "Method and System for Power Management Including Local Bounding of Device Group Power Consumption," and U.S. Patent Application Publication No. US 2006/0156042 to IBM, disclosing a "Method, System, and Calibration Technique for Power Measurement and Management Over Multiple Time Frames." While IBM has pioneered many aspects of power management in server systems, a variety of other power management protocols are also known in the art.

Many power management systems rely on specialized hardware and firmware that increase system cost. For example, one feedback-based power management system may involve a specialized motherboard having a built-in power meter circuit, ACPI, and other hardware and/or software elements for providing the feedback-based power control. While such systems can effectively and reliably manage power, the specialized motherboard configurations are generally more expensive than other industry standard motherboards. An improved power management system is therefore desired in view of the existing art. It would be desirable in some instances to lower system cost by substituting industry standard hardware elements for costlier, proprietary hardware configurations. For example, there is an economic incentive to use "industry standard" system motherboards substantially without modification in computer system products, because modifications (such as on-board power management circuits) increase cost and make the motherboard "non-standard."

SUMMARY OF THE INVENTION

The present invention includes power management systems and methods for enforcing power limits on devices of an electronic system by selectively reducing airflow to the devices.

A first embodiment provides a power management system for a computer system. The power management system includes a throttling module configured for selectively throttling a target component of the computer system in relation to the temperature of the target component. A power sensor is responsive to the power consumed by the target component; such as by sensing power consumed by the target component or the power consumed by a device on which the target component resides. An airflow system is configured for providing a variable airflow rate to the target component. A controller is in electronic communication with the power sensor and operatively coupled to the airflow system. The airflow system controls the airflow rate in relation to the power consumed by the target component, to selectively induce the throttling module to throttle the target component.

A second embodiment provides a power management system for a computer system having a plurality of servers. The power management system comprises a target component and throttling module included with each server. The throttling module is configured for selectively throttling the target component in relation to the temperature of the target component. A power sensor is responsive to the power consumed by each target component. An airflow system is configured for providing a variable airflow rate to each server. A controller is operatively coupled to the airflow system and configured for controlling the airflow rate to selected servers in relation to the power consumption of the selected servers or the included target components, to selectively induce the throttling modules to throttle the target component on each of the selected servers.

Other embodiments, aspects, and advantages of the invention will be apparent from the following description and the appended claims.

DETAILED DESCRIPTION OF PREFERRED EMBODIMENTS

Figure 1:
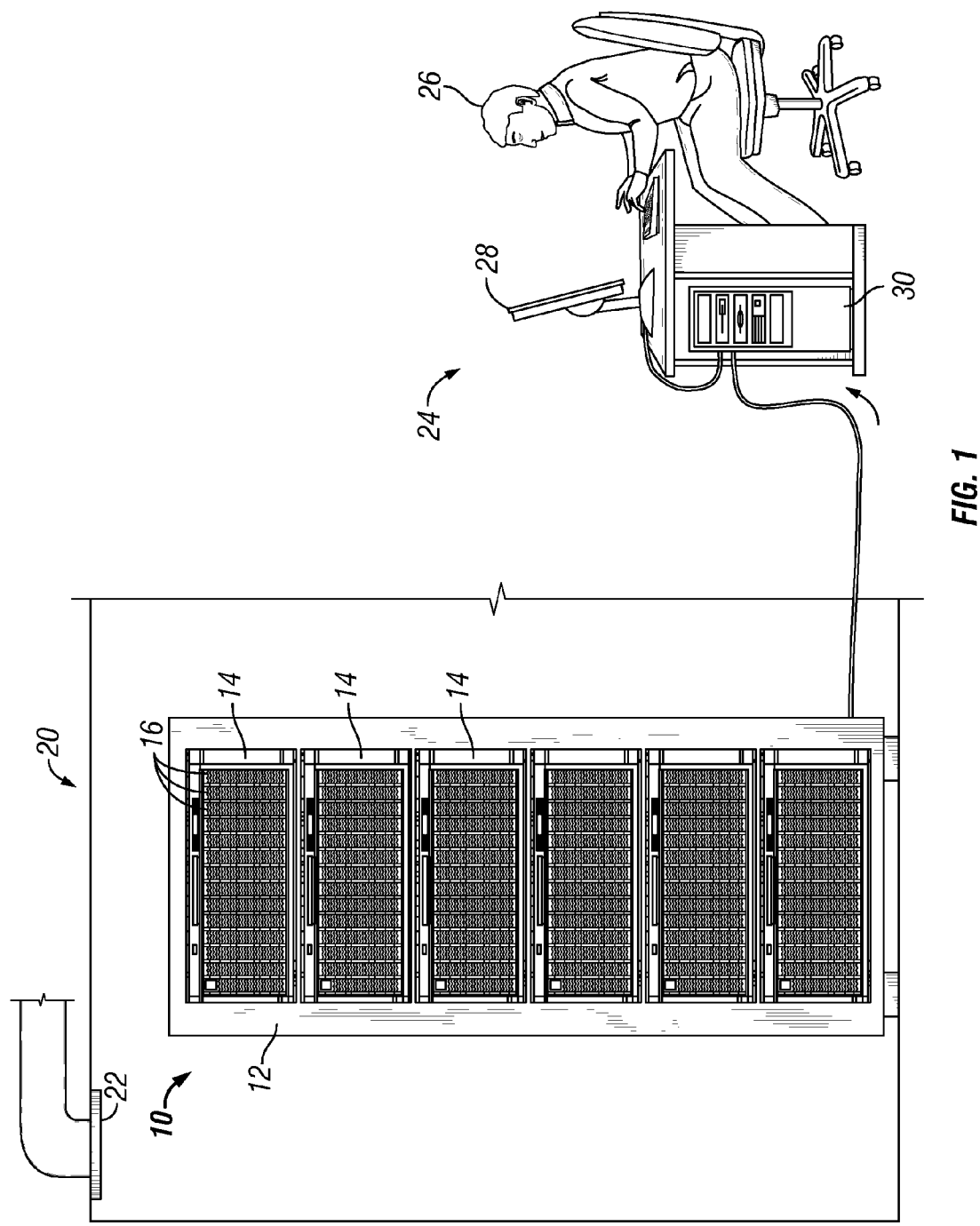
FIG. 1 is a front elevation view of an exemplary rack-mounted blade server system in a data center that may be power-managed according to the invention.

The present invention provides a novel power management system and method that may optionally be implemented in conventional hardware elements such as industry standard motherboards to minimize system cost while providing reliable power management. The present invention may be adapted for managing power in just about any computer system, from a standalone PC, to a multi-server rack system, to a high-density blade-server system. The power management capabilities provided by the invention are particularly well suited to rack-mountable server systems, due to the challenges of independently or collectively managing power to many servers simultaneously. Power to a device, such as a server, or specifically to a target component within the device, such as a processor within a server, may be limited by selectively reducing airflow to the device to induce throttling of a target component. The target component is frequently a processor, but may instead be system memory or other components for which throttling techniques are known in the art. A throttling module associated with the target component throttles the target component as a function of the temperature of the target component.

One embodiment of the invention is a power management system for selectively limiting average power consumption to individual servers in a rack. Each server may incorporate an optionally industry-standard type of motherboard having a processor with an included throttling module that allows the processor to operate as fast as possible within a specified temperature threshold. Power to each server may be monitored with a power meter external to the standard motherboard, and the power may be controlled using a shared controller that imposes a desired average power consumption limit on each server by selectively reducing airflow to selected servers to intentionally induce throttling on the selected servers. For example, airflow control elements such as dynamically controlled dampers, apertures, or vents could be operated to increase or decrease the amount of cool air provided to each server. The reduced airflow leads to an increase in the temperature of the processor to a value that induces throttling of the processor, without exceeding safe operating temperature limits. Therefore, the direct control over the cooling air flow rate provides indirect control over power consumption. This power control scheme may not have sufficient response time to immediately correct instantaneous power excursions, due to the lag time between reducing airflow and building up heat to induce throttling. Rather, this power control scheme is more likely to be used to control average power consumption over a period of time. This could be very beneficial, for example, if power costs vary throughout the day, in which case the scheme may be used to reduce power consumption during peak rate hours.

This configuration of a power management system according to the invention eliminates the need for a proprietary motherboard having a built-in power meter circuit, ACPI (Advanced Configuration and Power Interface), and other cost-adding components. Rather, a power meter circuit external to each motherboard may monitor power consumption of each motherboard. If the motherboard is consuming less than its allocated power, unrestricted airflow may be directed to the associated server (possibly subject to other factors, such as overall air consumption within the rack). As any particular server begins to approach a power consumption threshold, such as determined by a controller connected to the external power meter, the controller can begin to reduce airflow to the server. The amount of throttling may be fixed, such as an ON/OFF throttling that occurs at a specific temperature threshold, or the throttling may be variable, wherein the amount of throttling increases with temperature over a defined temperature range. The reduced airflow intentionally results in a temperature increase in the processor. When the processor reaches a first temperature threshold, the throttling module will begin to throttle the processor. Thus, the controller effectively reduces the power consumption of an individual server or the processor within the server by controlling the flow rate of cooling air to the server or the processor as long as the processor is operating in a safe temperature range. Additional temperature thresholds may also be specified, as a precaution. For example, a higher, second temperature threshold may initiate a soft shutdown to prevent component damage, and an even higher temperature threshold may initiate a hard shutdown.

FIG. 1 is a front elevation view of an exemplary rack-mounted blade server system ("rack system") 10 in a data center 20 that may be power-managed according to the invention. The rack system 10 includes many of the same components and design features of a conventional rack system. However, the rack system 10 is adapted to include hardware and software elements for implementing a power management scheme according to the present invention. Some familiar aspects of the rack system 10 include a rack 12 supporting six server chassis 14. Each server chassis 14 in this example consists of a 7 U by 28-in. (711-mm) deep chassis with a support structure for up to fourteen networked blade servers 16. Thus, the rack 12 holds up to eighty-four heat-generating blade servers and supporting modules, all of which must be power-managed and air-cooled. Each server chassis 14 contains a blower module shared by the servers 16 for circulating air through the servers 16 contained within the server chassis 14. Heated air expelled from the rack system 10 is taken up by an air intake 22 and circulated through a computer-room air-condition system (CRAC) that cools the air and returns it to the data center 20.

A workstation 24 is optionally networked with the servers 16 for helping a system administrator 26 remotely monitor and control the servers 16. The workstation 24 includes a management console 28, which has a customizable graphical administrative interface, and a management server 30, which can remotely support up to thousands of remote computer subsystems including the servers 16. Local software (e.g. a system "agent") may be installed on each server 16, allowing the management server 30 to selectively interface with the various servers 16 to monitor and control the servers 16. For example, an agent installed on a particular server 16 may warn the system administrator 26 if and when intervention is required for that blade server.

Figure 2:
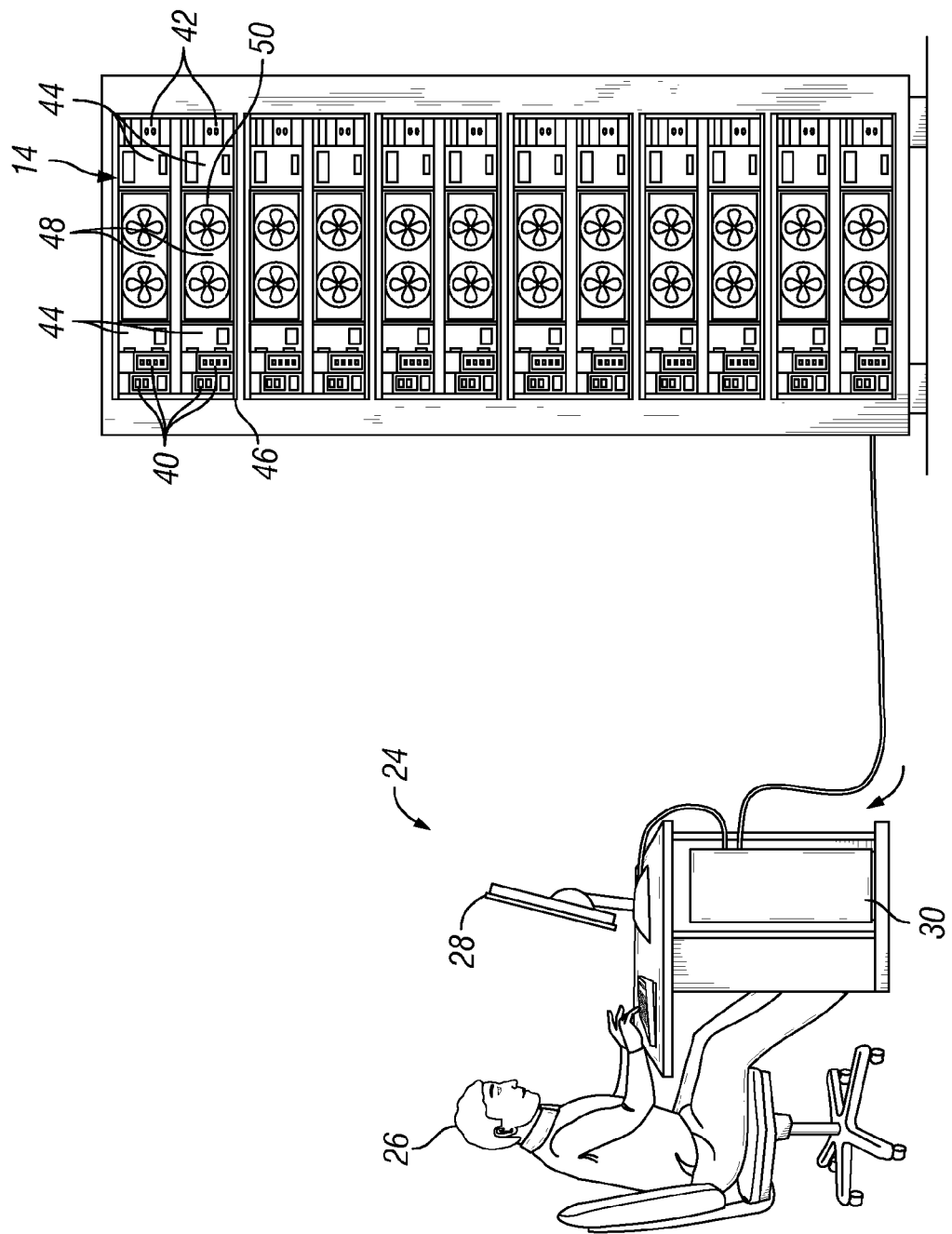
FIG. 2 is a rear elevation view of the rack system, further detailing the components visible from the rear of the server chassis.

FIG. 2 is a rear elevation view of the rack system 10, further detailing the components visible from the rear of the server chassis 14. Each chassis 14 supports the shared infrastructure for four switch modules 40, two management modules 42, four power modules 44, a rear information panel 46, and two blower modules 48, all of which may interface with one another via a midplane internal to the chassis 14. The blower modules 48 move air through the chassis 14 from the front (FIG. 1) to the rear (FIG. 2), thus providing the airflow necessary to keep the servers and supporting modules cool. Each blower module 48 is schematically shown as having two visible fans 50, though any number of fans may be included with a blower module, and the fans are not necessarily visible. Also, the fans 50 may be any of a variety of types known in the art, including axial or radial fans.

The management architecture for each chassis 14 may be based on a multi-tiered management infrastructure, including one or more chassis-level management module 42 that provides comprehensive support for all chassis components, and a server-level baseboard management controller (BMC) located on each blade 16. The BMC may work in conjunction with the management modules 42 to manage the blade 16. Management functions conventionally provided by the management module include: chassis configuration, chassis cooling (e.g. blower control and temperature sensing), power module control, blade initialization, switch module initialization, media selection and control (e.g. CD-ROM or floppy disk drive), remote and local console control, customer interface panel, chassis-level power management, power on/off control, chassis thermal sensing (e.g. monitoring thermal status and post alerts), Serial-over-LAN (SOL) session control and terminal server. Management functions conventionally provided by the blade BMC include: power on/off control, media control, keyboard and mouse control, video control, thermal sensing, communication with management module, blade power management, and SOL session.

Each chassis 14 includes blower modules 48 controlled by the management modules 42 for providing airflow to the blades 16. The management modules 42 further support an Ethernet connection to each switch slot for configuration and management. In addition to supporting normal processor management function, the BMC on each blade provides control and status by communicating with the management module(s) 42 over, for example, an RS-485 bus using an IPMI protocol. An external Ethernet link on the management modules 42 provides connectivity for remote management, including full console capability (KVM) with keystroke selection of the target processor blade. PS/2 and video ports on the management module enable local console (KVM) access to individual blades 16 with keystroke selection.

The present invention provides a novel power management scheme that may be applied to the rack system 10 to expand this management functionality. In particular, the power management scheme may be used to impose power limits on the server blades 16 by selectively reducing airflow to the blades 16 to induce throttling of selected blades. Advantageously, the power management scheme may be implemented on the rack system 10 using some conventional hardware and software elements, to minimize the cost of implementation. For example, the BMC and/or management modules may be adapted to include additional firmware and hardware configurations that utilize some existing system functionality. The ability to throttle processors and memory to control temperatures, as well as to control the blower modules to control cooling of the blades 16, are some of the functionality that may be harnessed in implementing a power management scheme according to the invention. Again, the rack system 10 is provided as a non-limiting example of a computer system to which the invention may be applied.

Figure 3:
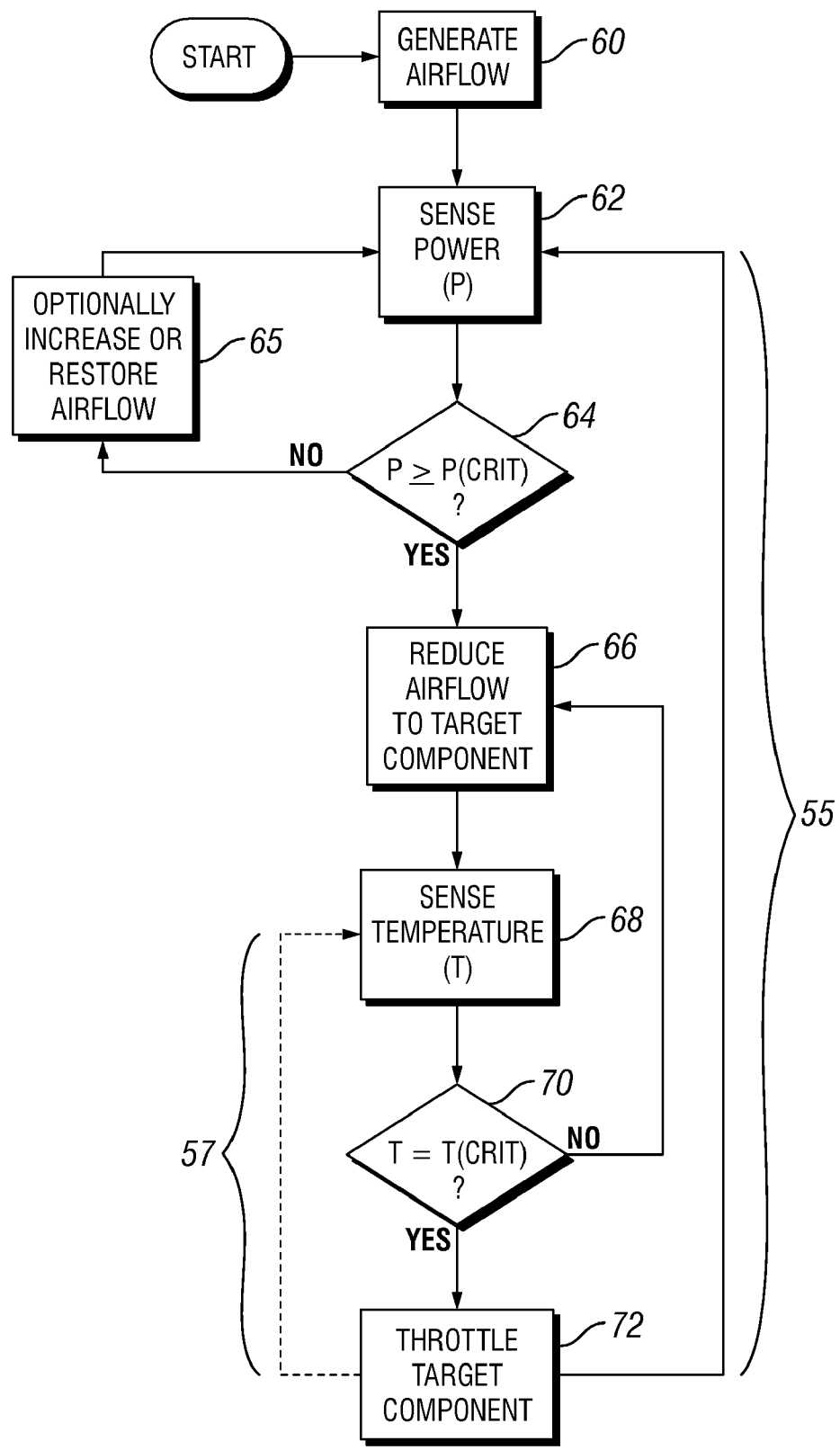
FIG. 3 is a flowchart outlining one embodiment of a power management scheme according to the invention.

FIG. 3 is a flowchart outlining one embodiment of a power management scheme ("method") according to the invention. The method is not system-specific, and is shown and discussed in a way that is intended to be adaptable to a variety of different computer systems. The method may be discussed in terms of generalized steps designated according to reference numerals. The order and flow of the steps, as presented, are illustrative of just one example of a control logic by which the invention may be implemented, and alternative sequences of steps may be conceived within the scope of the invention.

The method includes two "control loops." A "power control loop 55" is used to control power to a device, such as a server, or to a selected component (the "target component") disposed on the device, to ensure that the average power consumption of the device or the target component over a period of time does not exceed a preset power threshold. The power control loop 55 harnesses a "temperature control loop" 57 used to control temperature of the target component by selectively throttling the target component. The term "throttling" is used in the context of the invention to broadly include a variety of throttling techniques known in the art that generally also reduce or limit power consumption. In the case of a CPU, throttling techniques include reducing a clock frequency or operating voltage of the CPU, introducing wait or hold states into the activity of the CPU, placing related subsystems into power-saving modes of operation, or powering off unused circuitry.

The temperature control loop 57 may be embedded in the power control loop 55, as shown, in that the steps of the temperature control loop 57 are a subset of the steps of the power control loop 55. The temperature control loop 57 may be provided, for example, on an industry standard motherboard, wherein the target component is a processor. The processor may include a built-in throttling mechanism that senses temperature and throttles the processor enough to maximize processor activity level or throughput without exceeding a predefined temperature threshold or setpoint. The power control loop 55 exploits the functionality of the temperature control loop 57 by selectively reducing airflow to the device being managed, to purposely induce throttling of the target component by the temperature control loop 57. By selectively reducing airflow to induce throttling, the power control loop 55 limits power consumed by the target component and, accordingly, power consumed by the device. This power control scheme may not have sufficient response time to immediately correct instantaneous power excursions, due to the lag time between reducing airflow and building up heat to induce throttling. Rather, this power control scheme is more likely to be used to control average power consumption over a period of time. This could be very beneficial, for example, if power costs vary throughout the day, in which case the scheme may be used to reduce power consumption during peak rate hours.

Airflow is generated in step 60 for cooling a computer system. For example, in a standalone PC, airflow may be generated using an on-board cooling fan. In a rack-based server system (e.g. the rack system 10 of FIGS. 1 and 2), airflow may be generated by a shared blower module for cooling a plurality of included servers and other hardware. Step 62 involves determining the power consumption of the device to be controlled. The power consumption may be sensed by a power meter circuit external to the motherboard of the device. Typically, the power consumption is dynamic, and is based on a number of factors known to those skilled in the art. In conditional step 64, the sensed power P is compared to a predefined power threshold $P_{CRIT}$. $P_{CRIT}$ may be the "power threshold," i.e., the maximum average power limit selected for the device by a controller. Alternatively, $P_{CRIT}$ may be a value less than but approaching the power threshold, providing sufficient power margin (the difference between the sensed power and the power threshold) to begin gradually slowing any power increase prior to reaching the power threshold.

When the value of P reaches $P_{CRIT}$, airflow to the target component (or, more generally, airflow to the device housing the target component) is reduced according to step 66. The reduction of airflow will cause an increase in temperature of the target component. The temperature increase will trigger the temperature control loop 57. More particularly, the temperature is sensed in step 68 and compared to a temperature threshold $T_{CRIT}$ in step 70. If the value of T reaches $T_{CRIT}$ in step 70, then the temperature control loop 57 causes the target component to be throttled in step 72. The temperature increase will not be instantaneous, however, so power consumption P is continually monitored (step 62). As long as the power P is at least equal to $P_{CRIT}$, as determined in step 64, the blower may continue to operate at a reduced airflow rate (step 66) to induce a temperature increase. The airflow rate may even be further reduced with each iteration of step 66, to hasten the throttling of the target component.

While airflow might be reduced to reduce power consumption in one iteration of the power control loop 55, airflow may eventually be increased in a subsequent iteration of the power control loop 55. As indicated in conditional step 64, if P is less than $P_{CRIT}$, then airflow may be increased (such as by restoring normal airflow) in step 65. One condition that would cause P to drop sufficiently below $P_{CRIT}$ is if actual power consumption has been reduced. However, if this power drop occurred primarily due to a recent iteration of the power control loop 55, it may not be desired to immediately restore power, which is why step 65 is indicated as being optional. Thus, other criteria and steps not shown in the flowchart may be used to determine when and if to restore airflow in step 65. For example, a timer may be included in the power control loop so that once airflow is reduced to reduce power consumption, the system may continue to operate at the reduced airflow and power consumption for a predetermined period of time. Alternatively, the system may continue to operate at the reduced airflow and power consumption over a period of time sufficient to reduce the average power consumption to a desired level. Another condition that might cause P to drop sufficiently below $P_{CRIT}$ is if $P_{CRIT}$ were subsequently raised. $P_{CRIT}$ might be deliberately raised, for example, by a system administrator or as programmed by a system designer. An example of a situation in which it may be desirable to raise $P_{CRIT}$ is during periods of off-peak rate hours, during which it is acceptable to operate the component or system at higher power consumption levels.

The power control loop 55 and temperature control loop 57 may operate with variable intensity in relation to the respective values of P and T. For example, a variable throttling value may be associated with a critical range of temperature values. An initial level of throttling may be imposed on the target component in response to T reaching the lower end of the critical temperature range. As T increases, the throttling value may increase in response (i.e. the processor activity level may be further reduced). Likewise, a variable amount of airflow may be associated with a range of power consumption values whose upper limit is equal to the selected power threshold. The lower end of this critical range of power values may trigger the onset of airflow reduction, to bring about throttling. As P increases toward the power threshold, the airflow may be further reduced, to hasten the onset of throttling or, if the component is already being throttled, to increase the amount of throttling (i.e. further decrease processor activity).

Additional temperature thresholds may optionally be specified for the processor, as well. For example, the first temperature threshold may be selected to induce throttling, as described above, while additional, higher temperature thresholds may be selected for inducing further power saving functions. For example, a second, higher temperature threshold may induce a soft shutdown, wherein the operating system is allowed to prepare in a prescribed manner (such as to backup data currently in RAM) before removing power to the processor. A third, even higher temperature threshold may induce a hard shutdown, wherein power is quickly removed from the processor without allowing the operating system the opportunity to prepare as it would during a soft shutdown. While the soft and hard shutdowns may provide substantially the same power reduction, the hard shutdown would more likely be specified for temperatures at which there is not enough time to perform a soft shutdown without damage to the processor, and the soft shutdown would more likely be specified in situations where the processor is not yet hot enough to pose an immediate risk of overheating. These additional temperature thresholds may be provided both to protect the chip and supporting components from overheating, as well as to provide additional, more pronounced power-saving measures by the power control loop 55.

A further example of a power-saving measure that could be performed in response to reaching a temperature threshold is to place a computer system in a state of hibernation. Hibernation is a feature provided by some operating systems where RAM may be written to non-volatile storage, such as to a hard disk before powering off the system. Later the system can be restored to the state it was in when hibernation was invoked, so that programs can continue executing as if nothing happened. The process of hibernating and restoring from hibernation is also generally faster than a hard reboot and, if necessary, can be done without user interaction. Thus, the use of hibernation as an optional step of the power control loop provides the power control loop the ability to perform more pronounced power reduction for a period of time, and promptly restoring the system to normal operation without user intervention.

Figure 4:
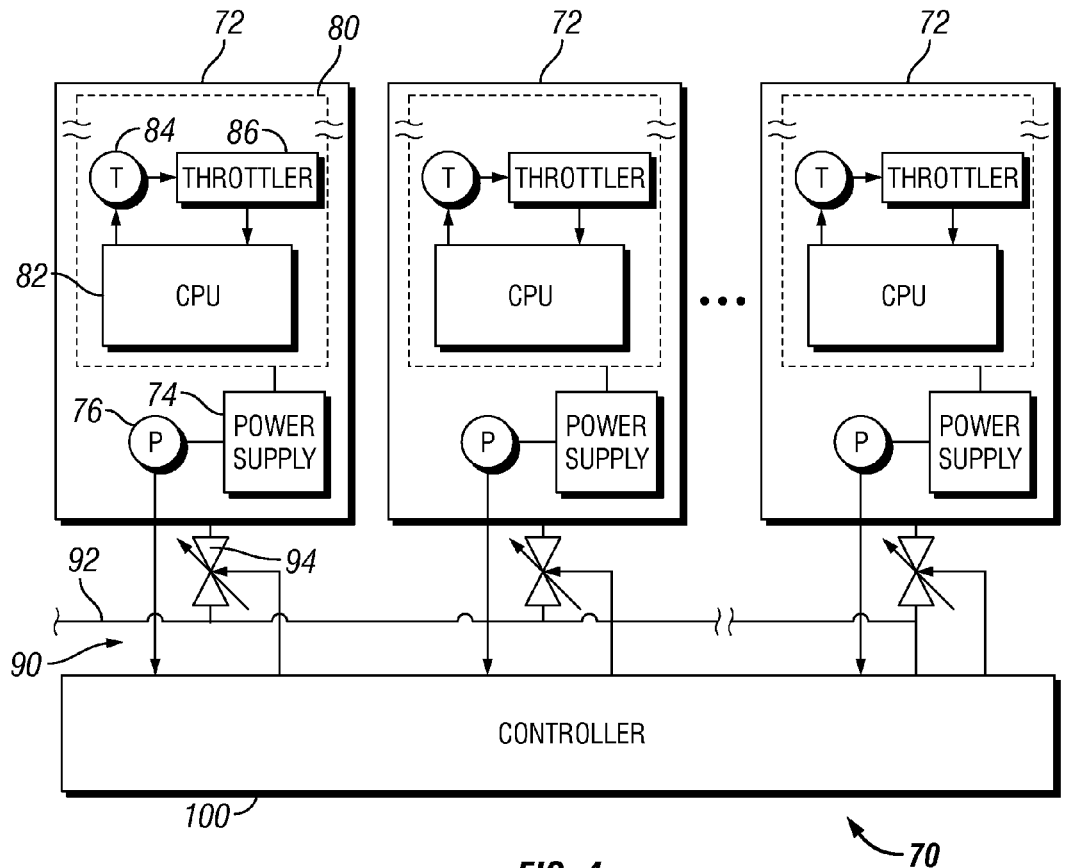
FIG. 4 is a schematic diagram of a computer system that includes a power management system according to the invention.

FIG. 4 is a schematic diagram of a computer system 70 that includes a power management system according to the invention. The computer system 70 includes any number of hardware devices 72 to be power-managed. An optionally shared ("global") controller 100 may govern the computer system 70 to implement a power management scheme according to the invention. In the context of a multi-server rack system, for example, each hardware device 72 may be a server, and the controller 100 may be a management module installed in a multi-server chassis. In that same context, each server may include a baseboard management controller (BMC) that cooperatively manages the server with the management module.

Each device 72 includes a motherboard 80, a power supply 74 for supplying power to the motherboard 80, and a power meter circuit 76 for sensing the power consumption of the motherboard 80. The controller 100 is in electronic communication with the power meter circuits 76 for monitoring the power consumption for each device. The power meter circuit 76 is optionally external to the motherboard 80, as drawn. Using an external power meter circuit 76, the DC power lines need only be passed to the motherboard 80, and no circuitry is required on the motherboard 80. By contrast, an internal power meter would require additional signal lines for electronic communication with the power meter circuit, and such modifications are generally not available in industry-standard, non-proprietary motherboards. The motherboard 80 includes a processor ("CPU") 82, a temperature sensor 84 for monitoring the temperature of the CPU 82, and a throttling mechanism ("throttler") 86 for selectively throttling the CPU 82 in relation to the sensed temperature. In one implementation of the system 70, the temperature sensor 84 and/or the throttler 86 may be elements of a temperature control system built-in to the CPU 82.

An airflow system generally indicated at 90 provides variable airflow to each of the devices 72. The airflow system 90 includes an optionally shared airflow source 92 and individually adjustable airflow control mechanisms 94 associated with each device 72 for controlling the amount of airflow each device 72 receives. Each airflow control mechanism 94 may include one or more valve, flap, vane, vent, or other airflow control elements known in the art. The airflow control mechanisms 94 are preferably variable, as indicated schematically by the variable flow-rate valve symbol, to provide a range of selectable airflow values. The controller 100 is in electronic communication with the airflow system 90 for individually controlling the airflow control mechanism 94 associated with each device 72, to individually control the amount of airflow each device 72 receives in relation to its power consumption.

The power management scheme outline in the flowchart of FIG. 3 may essentially be implemented on the schematically-shown computer system 70 of FIG. 4. Airflow is supplied to the computer system 70 via the airflow source 92. Power consumption of each device 72 (or, alternatively, power consumption of the CPU 82 associated with each device 72) is sensed by the external power meter circuit 76. Each power meter circuit 76 generates a signal representative of the sensed power, and outputs the signal to the controller 100. The controller 100 continuously monitors the power consumption of the devices 72 or CPU 82, as the case may be, and compares the sensed power consumption to a power consumption threshold on each device 72 or CPU 82. When the power consumption of a particular device 72 or CPU 82 reaches or approaches its power threshold, the controller 100 can selectively operate the associated airflow control mechanism 94 to reduce the airflow to that device 72. The temperature of the CPU 82 will typically increase in response to the controller 100 reducing airflow to a device 72.

Concurrently with the controller 100 monitoring power consumption and adjusting the airflow to each device 72, each temperature sensor 84 may continuously monitor the temperature of its associated CPU 82, and output a temperature signal representative of the sensed temperature. The throttler 86 selectively throttles the CPU 82 in relation to the sensed temperature. The throttler 86 may provide substantially no throttling at temperatures well below the temperature threshold selected for the CPU 82. The throttler 86 may initiate throttling when the sensed temperature reaches the temperature threshold. The throttler 86 may dynamically throttle the CPU 82, such as to increase throttling (e.g. reduce processor voltage or activity level) in response to any further temperature increase.

Thus, the controller 100 may impose the power thresholds on each selected device 72 (or CPU 82) by controlling and selectively reducing airflow in relation to the power consumption of the device. The temperature feedback provided by the temperature sensor 84 is used to determine the amount of throttling necessary to avoid exceeding the temperature threshold. In conjunction with this temperature-feedback, the power consumption feedback provided by the external power meter circuit 76 is used to determine the amount of airflow reduction needed to maintain each device 72 within its associated power threshold. This multi-tiered (temperature and power consumption) feedback control scheme thereby allows the controller 100 to impose the power thresholds assigned to each device 72.

Figure 5:
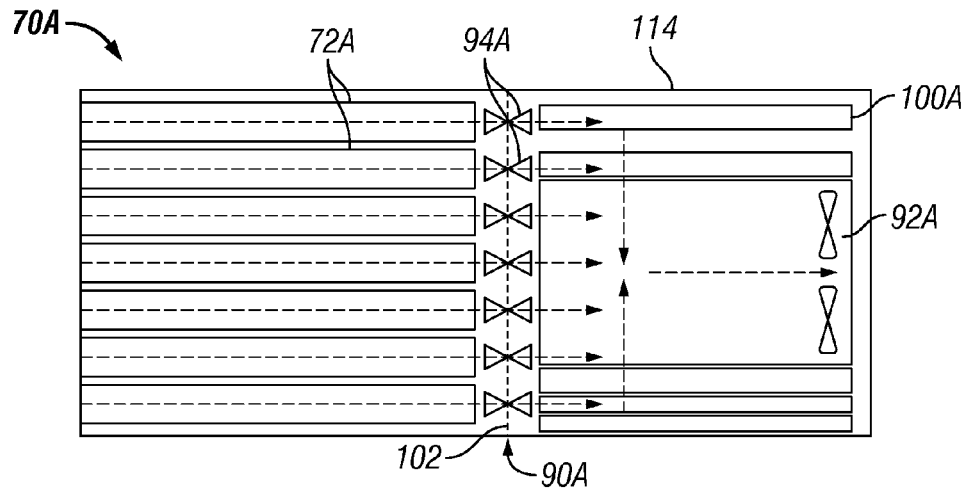
FIG. 5 is a plan view of the computer system implemented in the form of a rack system.

FIG. 5 is a plan view of the computer system implemented in the form of a rack system 70A, wherein reference numerals appended with an "A" indicate specific, optional implementations of like-numbered elements schematically shown in FIG. 4. The devices are seven blade servers 72A disposed in a chassis 114 and connected via midplane 102. The airflow source comprises a blower module 92A for generating airflow through the chassis 114, so that airflow passes through the blade servers 72A. The net airflow through the chassis 114 is divided among the plurality of generally parallel airflow passages defined by the blade servers 72A. Each of the seven airflow control mechanisms are again schematically illustrated as variable flow valves 94. Each valve 94 controls the airflow through a respective one of the seven blade servers 72A. The controller 100 is implemented here as a management module 100A in electronic communication with each of the valves 94 via the midplane 102. The management module 100A controls airflow to each blade server 72A to selectively induce throttling to impose the power limit allocated to each blade server 72A.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

What is claimed is:

1. A power management system for a computer system, comprising:
   a throttling module configured for selectively throttling a target component of the computer system in relation to the temperature of the target component;
   a power sensor responsive to the power consumed by the target component;
   an airflow system configured for providing a variable airflow rate to the target component; and
   a controller in electronic communication with the power sensor and operatively coupled to the airflow system for controlling the airflow rate in relation to the power consumed by the target component, to selectively induce the throttling module to throttle the target component.

2. The power management system of claim 1, wherein the controller is configured for reducing the airflow as needed to maintain the power consumed by the target component or the power consumed by a device on which the target component resides within a selected power consumption threshold.

3. The power management system of claim 1, wherein the target component comprises a CPU or memory.

4. The power management system of claim 1, wherein the throttling module comprises a temperature sensor built-in to the target component.

5. The management system of claim 1, wherein the throttling module is configured to substantially maximize the activity level of the target component without exceeding a selected temperature threshold.

6. The power management system of claim 1, wherein the power sensor is external to a motherboard of the computer system.

7. The power management system of claim 1, wherein the airflow system comprises:
   an airflow source for generating the airflow to a plurality of devices, wherein the target component is included on one of the devices; and an airflow restricting mechanism operatively coupled with the controller for controlling airflow to the device on which the target component is included.

8. The power management system of claim 7, wherein the controller comprises one or both of a management module in electronic communication with the plurality of devices and a baseboard management controller disposed on each device in communication with the management module.

9. A power management system for a computer system having a plurality of servers, the power management system comprising:
   a target component and throttling module included with each server, the throttling module configured for selectively throttling the target component in relation to the temperature of the target component;
   a power sensor responsive to the power consumed by the target component;
   an airflow system configured for providing a variable airflow rate to each server; and
   a controller operatively coupled to the airflow system and configured for controlling the airflow rate to selected servers in relation to the power consumption of the selected servers or the included target components, to selectively induce the throttling modules to throttle the target component on each of the selected servers.

10. The power management system of claim 9, wherein the controller is configured for reducing the airflow as needed to maintain the power consumed by each target component or the power consumed by each server within a selected power consumption threshold.

11. The power management system of claim 9, wherein each target component comprises a CPU or memory.

12. The power management system of claim 9, wherein each throttling module comprises a temperature sensor built-in to the target component.

13. The power management system of claim 9, wherein each throttling module is configured to substantially maximize the activity level of the target component without exceeding a selected temperature threshold.

14. The power management system of claim 9, wherein the power sensor is external to a motherboard of each server.

15. The power management system of claim 9, wherein the airflow system comprises:
   an airflow source for generating the airflow to the plurality of servers; and
   an airflow restricting mechanism operatively coupled with the controller for independently controlling airflow to each server.

16. The power management system of claim 9, wherein the controller comprises one or both of a management module in electronic communication with the plurality of servers and a baseboard management controller disposed on each server in communication with the management module.

17. A method of managing power in a computer system, comprising:
   sensing a temperature of a target component of the computer system;
   selectively throttling the target component in relation to the temperature of the target component;
   sensing a power consumption of the target component or a device on which the target component resides; and
   selectively reducing the airflow to the target component in relation to the power consumed by the target component, to selectively induce the throttling module to throttle the target component.

18. The method of claim 17, further comprising:
   reducing the airflow as needed to maintain the power consumed by the target component or the power consumption of the device on which the target component resides within a selected power consumption threshold.

19. The method of claim 17, further comprising:
   providing airflow to a plurality of servers of the computer system, wherein the target component resides on one of the servers; and
   independently reducing the airflow to the server on which the target component resides to induce throttling of the target component.

20. The method of claim 17, further comprising throttling the target component sufficiently to maintain the target component within a predefined temperature threshold while substantially maximizing the activity level of the target component.

* * * * *